United States Patent [19]
Baier et al.

[11] Patent Number: 6,060,964
[45] Date of Patent: May 9, 2000

[54] SURFACE ACOUSTIC WAVE FILTER WITH PLURAL SUBSTANTIALLY IDENTICAL ACOUSTIC TRACKS

[75] Inventors: Thomas Baier; Jürgen Machui, both of München; Isidor Schropp, Ernsgaden; Günter Müller, München, all of Germany

[73] Assignee: Siemens Matsushita Components GmbH & Co. KG, Munich, Germany

[21] Appl. No.: 09/100,857

[22] Filed: Jun. 19, 1998

Related U.S. Application Data

[63] Continuation of application No. PCT/DE96/02414, Dec. 16, 1996.

[30] Foreign Application Priority Data

Dec. 19, 1995 [DE] Germany .......................... 195 47 470

[51] Int. Cl.[7] .................................................. H03H 9/64
[52] U.S. Cl. ...................... 333/193; 333/195; 310/313 B
[58] Field of Search ................................... 333/193–196; 310/313 R, 313 B, 313 C, 313 D

[56] References Cited

U.S. PATENT DOCUMENTS

| | | | |
|---|---|---|---|
| 3,550,045 | 12/1970 | Adler | 333/193 |
| 4,425,554 | 1/1984 | Morishita et al. | 333/195 |
| 4,539,502 | 9/1985 | Este et al. | 310/313 B |
| 5,379,010 | 1/1995 | Ruile et al. | 333/195 |
| 5,475,348 | 12/1995 | Hode et al. | 333/195 |

FOREIGN PATENT DOCUMENTS

| | | | |
|---|---|---|---|
| 3942140A1 | 6/1991 | Germany . | |
| 59-153318 | 9/1984 | Japan | 333/193 |
| 61-142812 | 6/1986 | Japan | 333/195 |
| WO 93/13595 | 7/1993 | WIPO | 333/193 |

OTHER PUBLICATIONS

"Design of a Low Loss SAW Reflector Filter with Extremely Wide Bandwidth for Mobile Communication Systems" (Müller et al.), IEEE Transactions on Microwave Theory and Techniques, Dec. 1993, No. 12, New York, pp. 2147–2155.

*Primary Examiner*—Robert Pascal
*Assistant Examiner*—Barbara Summons
*Attorney, Agent, or Firm*—Herbert L. Lerner; Laurence A. Greenberg; Werner H. Stemer

[57] ABSTRACT

The surface acoustic wave (SAW) filter has two or more identical acoustic tracks. The input side of the tracks is electrically connected in parallel and the output side is electrically connected in series, whereby the impedance of input side of the SAW filter is reduced relative to the impedance of the individual acoustic tracks.

3 Claims, 1 Drawing Sheet

SURFACE ACOUSTIC WAVE FILTER WITH PLURAL SUBSTANTIALLY IDENTICAL ACOUSTIC TRACKS

CROSS-REFERENCE TO RELATED APPLICATION

This is a continuation of copending international application PCT/DE96/02414, filed Dec. 16, 1996, which designated the United States.

BACKGROUND OF THE INVENTION

FIELD OF THE INVENTION

The present invention relates to filters operating with surface acoustic waves, i.e. to SAW filters, with at least two acoustic tracks. Very small input impedances in SAW filters can often be achieved only by connecting a plurality of acoustic tracks electrically in parallel.

It is an object of the invention to provide a SAW filter with small input impedance and large output impedance.

SUMMARY OF THE INVENTION

With the foregoing and other objects in view there is provided, in accordance with the invention, a filter operating with surface acoustic waves, comprising:

a plurality of substantially identical acoustic tracks each having an input side and an output side;

the acoustic tracks being electrically connected in parallel on the input side and electrically connected in series on the output side, and the plurality of acoustic tracks having an input impedance smaller than an input impedance of a single one of the acoustic tracks.

In accordance with an added feature of the invention, each of the acoustic tracks includes at least one input interdigital transducer, an output interdigital transducer, and end reflectors on mutually opposite sides from the interdigital transducers within each track.

In accordance with a concomitant feature of the invention, the plurality of acoustic tracks are two identical acoustic tracks.

Other features which are considered as characteristic for the invention are set forth in the appended claims.

Although the invention is illustrated and described herein as embodied in a filter operating with surface acoustic waves SAW filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
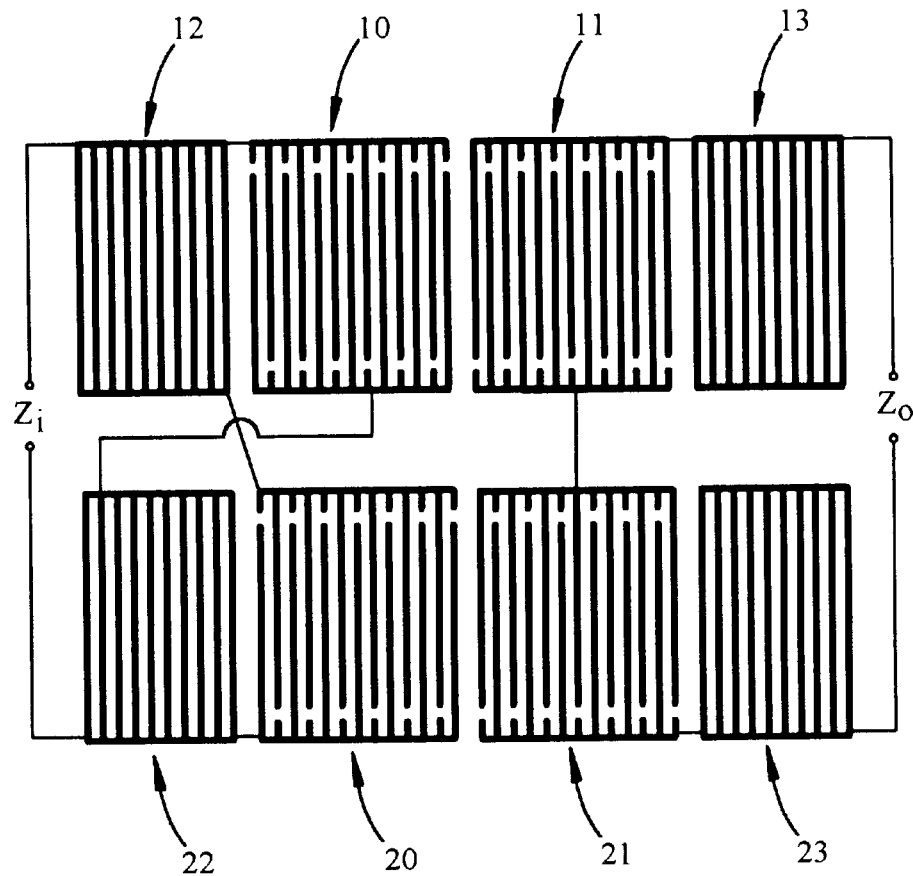
FIG. 1 is a schematic illustration of an SAW filter with two acoustic tracks.

Referring now to the figures of the drawing in detail and first, particularly, to FIG. 1 thereof, there is seen an SAW filter with two acoustic tracks. Each track includes an input interdigital transducer (IDT) 10 or 20, an output interdigital transducer (IDT) 11 or 21, as well as in each case two end reflectors 12, 13 or 22, 23, on mutually opposite sides of the interdigital transducers. Still with reference to FIG. 1, according to the invention, the components on the input side, that is to say the interdigital transducers 10, 20 and the end reflectors 12, 22, are electrically connected in parallel, while the components on the output side, that is to say the interdigital transducers 11, 21 and the end reflectors 13, 23, are electrically connected in series. The input impedance is in this case denoted by $Z_i$, and the output impedance by $Z_o$.

Figure 2:
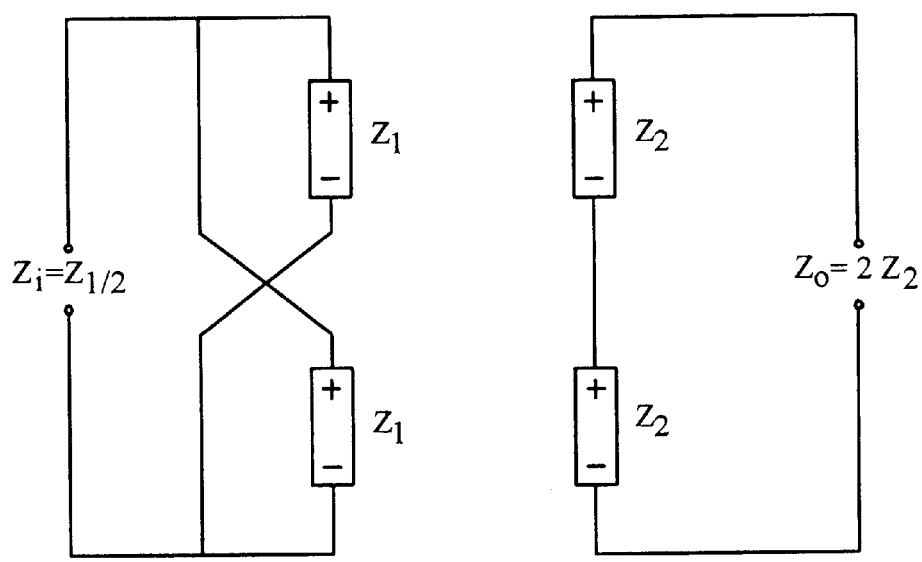
FIG. 2 shows an electrical equivalent circuit of the input side and the output side, respectively, of the filter according to FIG. 1.

According to the electrical equivalent circuit on the lefthand side of FIG. 2, the electrical impedances on the input side according to FIG. 1, which are denoted by $Z_1$, are electrically connected in parallel. In a corresponding manner, according to the electrical equivalent circuit on the righthand side of FIG. 2, the electrical impedances on the output side, which are denoted by $Z_2$, are electrically connected in series.

Such interconnection halves the input impedance Zi in comparison with the individual track. In other words, $Z_i = 1/2 \, Z_1$. Conversely, the output impedance $Z_o$ is doubled in comparison with that of the individual track. In other words $Z_o = 2 Z_2$. The invention is not limited to embodiments of SAW filters having two acoustic tracks. Corresponding relationships also result for SAW filters having more than two acoustic tracks.

Furthermore, the invention also applies to filter embodiments having other component combinations in the acoustic tracks, for example also to embodiments without reflectors.

We claim:

1. A filter operating with surface acoustic waves, comprising:

a plurality of substantially identical acoustic tracks each having an input side and an output side;

said acoustic tracks being electrically connected in parallel on said input side and electrically connected in series on said output side, and said plurality of acoustic tracks having an input impedance smaller than an input impedance of a single one of said acoustic tracks.

2. The surface acoustic wave filter according to claim 1, wherein each of said acoustic tracks includes at least one input interdigital transducer, an output interdigital transducer, and end reflectors on mutually opposite sides from said interdigital transducers within each track.

3. The surface acoustic wave filter according to claim 1, wherein said plurality of acoustic tracks are two identical acoustic tracks.

* * * * *